United States Patent
Noguchi et al.

(10) Patent No.: US 9,530,907 B2
(45) Date of Patent: Dec. 27, 2016

(54) OPTICAL MODULE AND METHOD OF MANUFACTURING OPTICAL MODULE

(71) Applicant: Oclaro Japan, Inc., Kanagawa (JP)

(72) Inventors: Daisuke Noguchi, Tokyo (JP);
Masahiro Hirai, Kanagawa (JP);
Hiroshi Yamamoto, Tokyo (JP)

(73) Assignee: OCLARO JAPAN, INC., Kanagawa (JP)

( * ) Notice: Subject to any disclaimer, the term of this patent is extended or adjusted under 35 U.S.C. 154(b) by 0 days.

(21) Appl. No.: 14/791,782

(22) Filed: Jul. 6, 2015

(65) Prior Publication Data

US 2016/0006210 A1    Jan. 7, 2016

(30) Foreign Application Priority Data

Jul. 7, 2014    (JP) ................................. 2014-140057

(51) Int. Cl.
| H01L 31/024 | (2014.01) |
| H01L 31/02 | (2006.01) |
| H01L 31/0203 | (2014.01) |
| H01L 33/48 | (2010.01) |

(52) U.S. Cl.
CPC ......... *H01L 31/024* (2013.01); *H01L 31/0203* (2013.01); *H01L 33/483* (2013.01); *Y02P 70/521* (2015.11)

(58) Field of Classification Search
CPC ...... H01L 31/02; H01L 31/18; H01L 31/0203; H01L 31/0232; H01L 31/024; H01L 31/02002; H01L 2924/02013; H01L 2924/01014;H01L 2924/01029; H01S 5/022; H01S 5/02248; H01S 5/02272; H01S 5/02469; H01S 5/02212
USPC .............................................. 438/26; 257/459
See application file for complete search history.

(56) References Cited

U.S. PATENT DOCUMENTS

| | | | | |
|---|---|---|---|---|
| 2004/0037334 A1* | 2/2004 | Funada | ............... | H01S 5/02248 372/50.21 |
| 2007/0120134 A1* | 5/2007 | Oshima | ............... | H01S 5/02276 257/81 |
| 2007/0228535 A1* | 10/2007 | Fujino | ................. | H01S 5/02244 257/678 |
| 2010/0006863 A1* | 1/2010 | Ban | ..................... | H01L 31/0203 257/81 |
| 2010/0020839 A1* | 1/2010 | Fujino | ................. | H01S 5/02244 372/50.1 |

(Continued)

FOREIGN PATENT DOCUMENTS

| JP | 2006-80418 A | 3/2006 |
| JP | 2009-295717 A | 12/2009 |

*Primary Examiner* — Chuong A Luu
(74) *Attorney, Agent, or Firm* — Mattingly & Malur, PC

(57) ABSTRACT

An optical module includes an optical semiconductor device and a stem including a lead terminal configured to perform at least one of transmitting an electric signal to the optical semiconductor device or transmitting an electric signal output from the optical semiconductor device. The optical module also includes a substrate having a ground layer, a first opening through which the lead terminal passes, and a connecting portion configured to electrically connect the stem and the ground layer. The connecting portion is formed on one of an edge portion of the substrate and a surface of the substrate on a side on which the substrate is arranged on the stem.

7 Claims, 11 Drawing Sheets

(56) References Cited

U.S. PATENT DOCUMENTS

2011/0291144 A1* 12/2011 Yoshida ............... G02B 6/4204
  257/98
2012/0177321 A1* 7/2012 Kuwahara ............ G02B 6/4206
  385/35

* cited by examiner

OPTICAL MODULE AND METHOD OF MANUFACTURING OPTICAL MODULE

CROSS-REFERENCE TO RELATED APPLICATION

The present application claims priority from Japanese Application JP 2014-140057, the content of which is hereby incorporated by reference into this application.

BACKGROUND OF THE INVENTION

1. Field of the Invention

The present invention relates to an optical module and a method of manufacturing an optical module.

2. Description of the Related Art

A can-type optical module used in optical communication generally includes an electrically-grounded stem and a lead terminal that passes through the stem and is insulated from the stem. The stem and a cap mounted to the stem form a housing for accommodating an optical semiconductor device having a transmitting function and a receiving function. The lead terminal and the stem form a coaxial line. One endportion of the lead terminal is connected to the optical semiconductor device. Another end portion of the lead terminal is connected to a drive device configured to output a modulated electrical signal or to an integrated chip (IC) configured to amplify a signal photo-electrically converted by a light receiving element, via a wiring substrate such as a flexible printed circuit (FPC) having a signal line and a ground formed along the signal line. In order to simplify a description, a can-type optical module having a transmitting function is hereinafter used as an example.

Increases in communication speed are leading to an increase in the frequency of the modulated electrical signal output from the drive device. Due to the increase in the frequency of the electrical signal, reflection of the electrical signal tends to occur in a transmission line at locations at which there are mismatches in the characteristic impedance. Characteristic impedance mismatches tend to occur between, for example, the coaxial line, which is formed by the lead terminal and the stem, and the wiring substrate such as an FPC. Further, characteristic impedance mismatches may also occur between the coaxial line, which is formed by the lead terminal and the stem, and a portion of the lead terminal that is protruding from the stem. When a reflection occurs at a location at which there is a characteristic impedance mismatch, the reflection wave may be further reflected by the drive device, causing multiple reflections to occur in the transmission line. When such reflections occur, distortion occurs in the original modulated electrical signal, causing the waveform quality of the optical signal to deteriorate.

In order to suppress to a minimum the effects of characteristic impedance mismatches on the optical waveform at a connecting portion between the lead terminal and the FPC at which characteristic impedance mismatches tend to occur, Japanese Patent Application Laid-open No. 2006-080418 and Japanese Patent Application Laid-open No. 2009-295717 propose structures for suppressing characteristic impedance mismatches.

Specifically, Japanese Patent Application Laid-open No. 2006-080418 discloses a structure that uses a stem having a trench formed in a welded portion of a ground pin in order to increase the close contact properties of the connecting portion between the FPC and the stem, thereby preventing an increase in the inductance at the lead terminal portion. In Japanese Patent Application Laid-open No. 2009-295717, the wiring pattern of the FPC is processed so that changes in the impedance between the FPC and the coaxial line formed by the lead terminal and the stem are lessened, to thereby ensure sufficient optical waveform properties.

SUMMARY OF THE INVENTION

In recent years, in order to reduce the cost of the optical module, there have been demands for an inexpensive structure not only for the optical semiconductor device, but also for the housing accommodating the optical semiconductor device and for peripheral members.

However, for example, in a high-speed optical communication optical module in the 10 Gbit/s class, the effects of impedance mismatches are large, and hence it is common to use a stem having a trench formed in the welded portion of the ground pin like that in Japanese Patent Application Laid-open No. 2006-080418 or as illustrated in FIG. 14. Due to the costs involved in forming this trench, the cost of the stem itself increases, which hinders the realization of an inexpensive optical module. However, for a stem in which a trench has not been formed, impedance mismatches become an issue for the following reasons.

In general, in order to electrically connect the ground of the FPC and the ground of the package, namely, the entire package including the stem etc., of the optical module, a ground pin welded to the stem and a through-hole connected to a ground layer included in the FPC are soldered. In this case, the FPC interferes with the welded portion at the base of the ground pin, preventing the FPC from being in close contact with the stem. As a result, the inductance of the lead terminal portion becomes excessively large, and the portion serves as a point at which an impedance mismatch occurs.

Therefore, as described above, in order to eliminate impedance mismatches, it has been proposed to form a trench in the stem to prevent the welded portion of the ground pin from interfering with the surface bonded with the FPC. This proposal is described in more detail with reference to FIG. 14.

FIG. 14 is a diagram for illustrating an outline of a cross-section of an optical module according to the related art. As illustrated in FIG. 14, a seat 101a is fixed to a surface of a stem 101. A semiconductor laser 104 is supported by the seat 101a. The stem 101, which is formed of metal, is electrically grounded by being connected to a ground line formed on a flexible printed circuit (FPC) 107 described below. A cap 109 is joined to the stem 101 so as to cover the semiconductor laser 104. A housing 110 for accommodating the semiconductor laser 104 is formed from the stem 101 and the cap 109. The housing 110 ensures airtightness. An opening is formed in the cap 109. A lens 111 for collecting light from the semiconductor laser 104 is arranged in the opening.

Further, an optical module 120 includes lead terminals 102a and 102b. The lead terminals 102a and 102b pass through the stem 101. Note that, the lead terminals 102a and 102b are electrically insulated from the stem 101. Specifically, the stem 101 has through-holes that pass through the stem 101 in a thickness direction thereof. The lead terminals 102a and 102b are arranged on an inner side of those through-holes. The lead terminals 102a and 102b are each held on the inner side of the though-hole by an insulator 103, such as a glass material, filled in the through-hole. Note that, the lead terminal 102a is a terminal for transmitting modulated electrical signals to the semiconductor laser 104. The optical module 120 is driven in a differential manner.

A heat dissipation substrate 105 is mounted using solder, a conductive adhesive, and the like, to the seat 101a fixed to the stem 101. The heat dissipation substrate 105 is formed of an insulating material (e.g., aluminum nitride) having high thermal conductivity and a thermal expansion coefficient close to that of the semiconductor laser 104. A metalized wire is formed on the surface of the heat dissipation substrate 105.

As illustrated in FIG. 14, one end of the lead terminal 102a protrudes from the stem 101 toward an inner side of the housing 110. The lead terminal 102a protruding toward the inner side is connected to the metalized wire formed on the surface of the heat dissipation substrate 105 via a wire 106. The semiconductor laser 104 and the metalized wire formed on the surface of the heat dissipation substrate 105 are connected to each other via the wire 106.

The lead terminal 102b is a terminal for supplying power to a part other than the semiconductor laser 104. Specifically, for example, the lead terminal 102b is connected to a photodiode and the like for monitoring an output of the semiconductor laser 104. Note that, the optical module 120 does not need to include the lead terminal 102b.

A ground pin 102c is welded to the stem 101. A trench 121 is formed in the stem 101 so that a welded portion of the ground pin 102c does not interfere with the surface bonded with the FPC 107. The trench 121 allows the FPC 107 to be in close contact with the stem 101 without the FPC 107 lifting up from the surface of the stem 101. The ground pin 102c protruding to an outer side of the housing 110 is joined by a solder portion 108a with a though-hole (not shown) formed in the FPC 107.

However, in this case, processing costs are incurred in order to form the trench 121. Thus, in order to reduce impedance mismatches, it has been typical for an optical module to use a stem subjected to special processing to satisfy the required characteristics. However, in order to reduce costs, there is a need to employ a stem that is used in a versatile manner without needing to employ a stem subjected to special processing based on an application, namely, based on the required characteristics.

In view of those circumstances, it is an object of one or more embodiments of the present invention to realize an inexpensive optical module and the like for high-speed optical communication.

(1) In one or more embodiments of the present invention, an optical module includes an optical semiconductor device and a stem including a lead terminal configured to perform at least one of transmitting an electric signal to the optical semiconductor device or transmitting an electric signal output from the optical semiconductor device. The optical module also includes a substrate comprising a ground layer, a first opening through which the lead terminal passes, and a connecting portion configured to electrically connect the stem and the ground layer. The connecting portion is formed on one of an edge portion of the substrate and a surface of the substrate on a side on which the substrate is arranged on the stem.

(2) In the optical module according to (1), the connecting portion formed on the edge portion of the substrate includes an electrode portion formed extending from the ground layer in a notch of the substrate.

(3) In the optical module according to (1), the connecting portion formed on the surface of the substrate on the side on which the substrate is arranged on the stem is formed so that the ground layer is exposed at a part of an outer side of a region of the substrate at which the substrate and the stem oppose each other.

(4) In the optical module according to one of (1) to (3), the stem further includes a ground pin extending from a surface of the stem on a side on which the substrate is arranged. The substrate further includes a second opening through which the ground pin passes.

(5) In the optical module according to one of (1) to (4), the substrate further includes a transmission line electrically connected to the lead terminal. The transmission line includes a straight region and a matching region having a larger width than the straight region.

(6) In the optical module according to (5), the connecting portion is formed between a position at which the lead terminal and the transmission line of the substrate are connected to each other and a position at which the substrate is to be bent.

(7) In the optical module according to one of (1) to (6), the connecting portion is electrically connected to the stem by a solder portion.

(8) In one or more embodiments of the present invention, a method of manufacturing an optical module includes removing a ground pin from a stem comprising the ground pin and a lead terminal configured to perform at least one of transmitting an electric signal to an optical semiconductor device or transmitting an electric signal output from the optical semiconductor device; and connecting, after the ground pin has been removed, the stem and a substrate comprising a ground layer, a first opening through which the lead terminal passes, and a connecting portion electrically connected to the ground layer. The connecting of the stem and the substrate includes electrically connecting the connecting portion and the stem. The connecting portion is formed on one of an edge portion of the substrate and a surface of the substrate on a side on which the substrate is arranged on the stem.

DETAILED DESCRIPTION OF THE INVENTION

Figure 1:
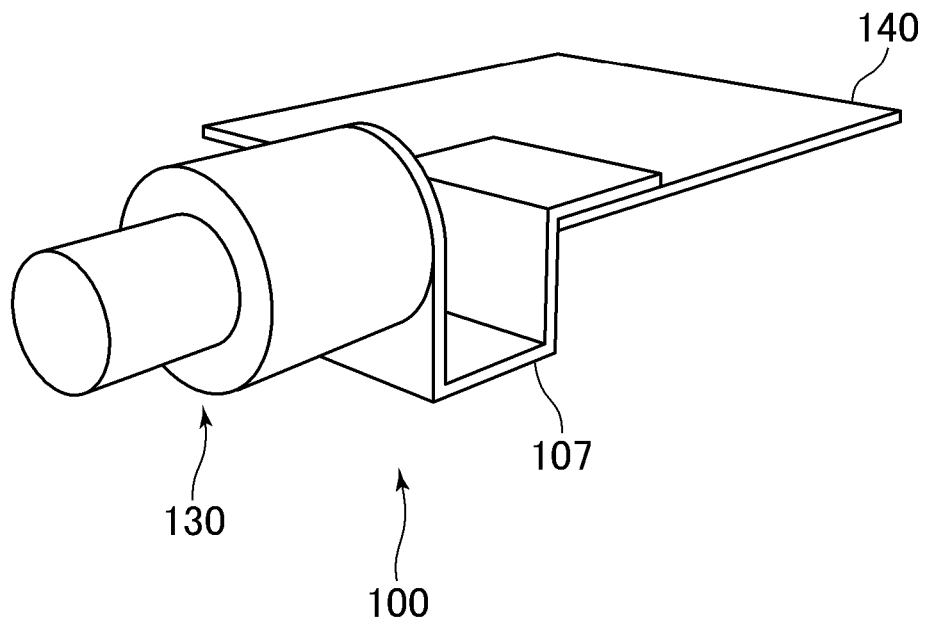
FIG. 1 is a diagram for illustrating an outline of an optical transceiver according to a first embodiment of the present invention.

Referring to the accompanying drawings, embodiments of the present invention are described below. In the drawings, the same or similar components are denoted by the same reference symbols, and repetitive description thereof is omitted.

[First Embodiment]

Figure 2:
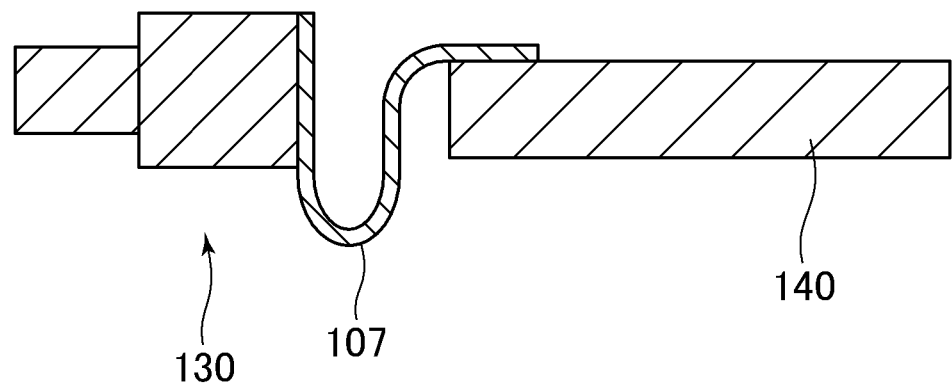
FIG. 2 is a diagram for illustrating an outline of a cross-section of the optical transceiver illustrated in FIG. 1.

FIG. 1 is a diagram for illustrating an outline of an optical transceiver according to a first embodiment of the present invention. FIG. 2 is a diagram for illustrating an outline of a cross-section of the optical transceiver illustrated in FIG. 1. As illustrated in FIG. 1 and FIG. 2, an optical transceiver 100 includes an optical module 130, an FPC 107 arranged on the optical module 130, and a substrate 140 that is connected to the FPC 107 and has a drive device and the like mounted thereon. The FPC 107, which is bent at predetermined positions for use as illustrated in FIG. 1, is described in more detail later.

Next, the optical module 130 according to this embodiment is described. Note that, for ease of convenience in the following description, first, a stem 101 included in the optical module 130 is described. Further, although the optical module including an optical transmitter function is described here, the present invention may even be applied in an optical module that includes an optical receiver function.

Figure 3:
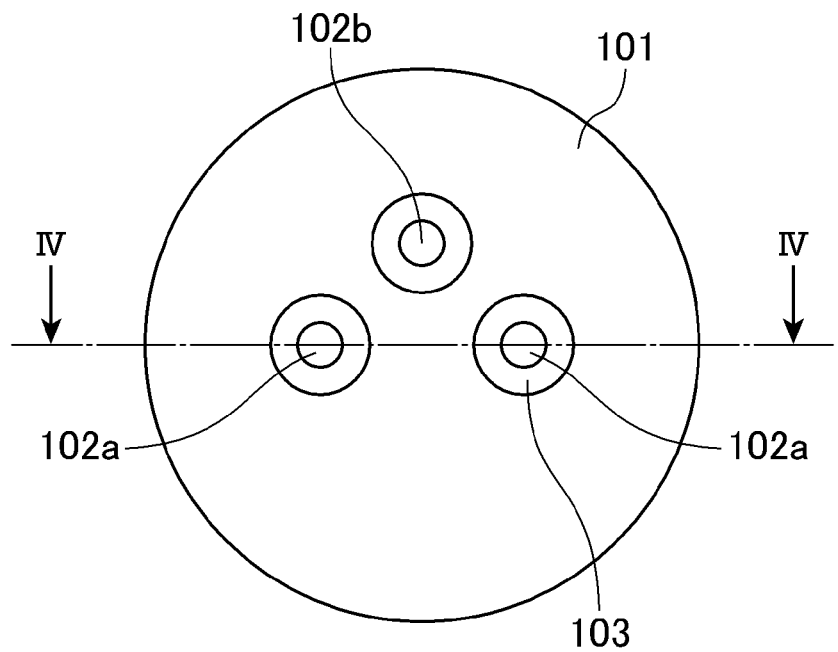
FIG. 3 is a diagram for illustrating an example of a front view of a stem of an optical module according to the first embodiment.
Figure 4:
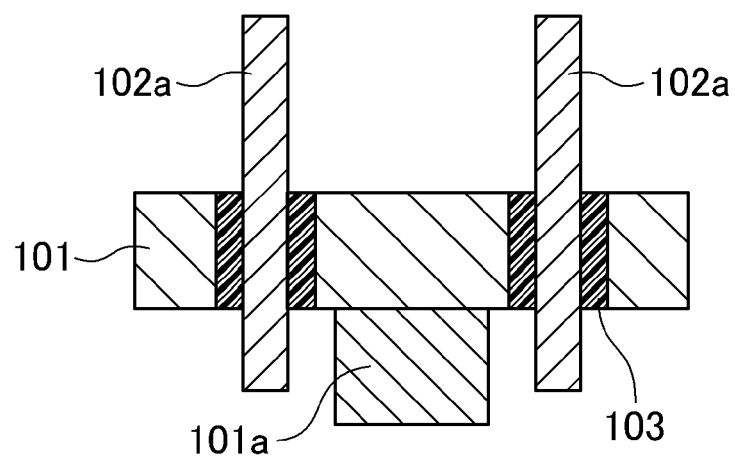
FIG. 4 is a diagram for illustrating an example of an outline of a cross-section taken along the line IV-IV of FIG. 3.

FIG. 3 is a diagram for illustrating an example of a front view of the stem of the optical module. FIG. 4 is a diagram for illustrating an example of an outline of a cross-section taken along the line IV-IV of FIG. 3. As illustrated in FIG. 3 and FIG. 4, the stem 101 according to this embodiment includes, for example, two openings through which two lead terminals 102a for supplying power to an optical semiconductor device (e.g., an optical semiconductor laser 104) pass. The stem 101 does not include a lead terminal corresponding to a ground pin that is included in the related art. Thus, the stem, which does not include a ground pin or a welded portion thereof, has a lower cost than a stem in which a trench has been formed, enabling an inexpensive optical module to be realized. The ground connection between the FPC 107 and the stem is described later.

The lead terminal 102a is held in each of those two openings via an insulator 103. A seat 101a for holding an optical semiconductor device and the like is arranged on another surface of the stem 101, namely, the surface opposing the surface on which the FPC 107 is arranged. The seat 101a has the same electric potential as the stem 101.

The stem 101 may further include an opening through which a lead terminal 102b connected to a photodiode and the like for monitoring the output of the optical semiconductor laser 104 passes. In this case, the lead terminal 102b is held in the opening of the stem 101 via the insulator 103 in the same manner as described above.

Figure 5:
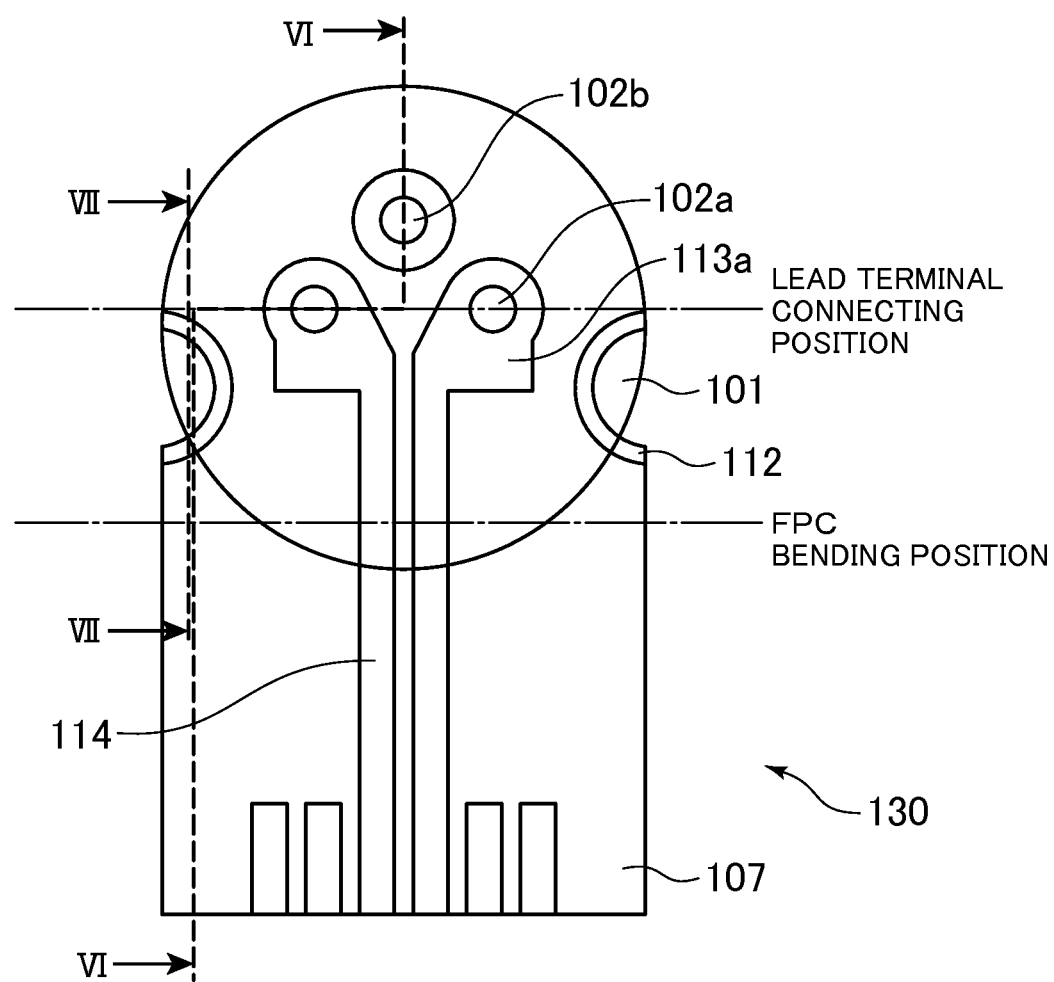
FIG. 5 is a diagram for illustrating an example of an outline of a plan view of an FPC of the optical module according to the first embodiment.
Figure 6:
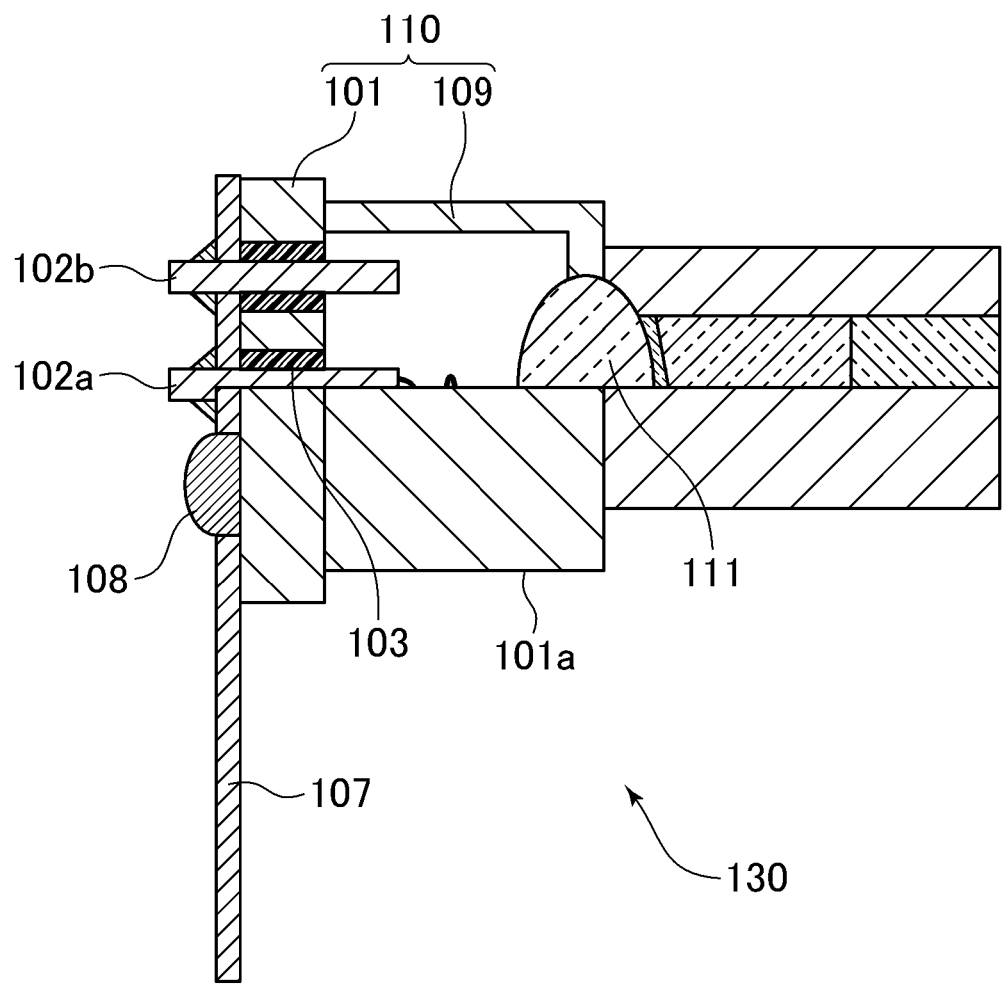
FIG. 6 is a diagram for illustrating an example of an outline of a cross-section taken along the line VI-VI of FIG. 5.
Figure 7:
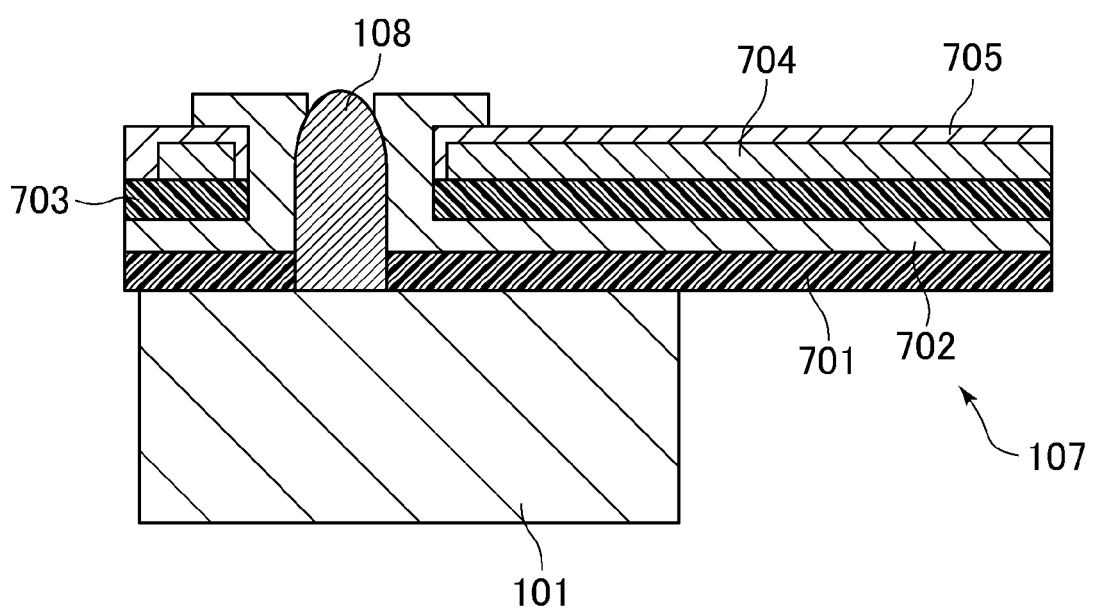
FIG. 7 is a diagram for illustrating an example of an outline of a cross-section taken along the line VII-VII of FIG. 5.

FIG. 5 is a diagram for illustrating an example of an outline of a plan view of an FPC of the optical module. FIG. 6 is a diagram for illustrating an example of an outline of a cross-section taken along the line VI-VI of FIG. 5. FIG. 7 is a diagram for illustrating an example of an outline of a cross-section taken along the line VII-VII of FIG. 5.

As illustrated in FIG. 6, the optical module 130 includes the stem 101, the FPC 107, a lens 111, and the like. The stem 101 includes the seat 101a on the opposite side to the FPC 107. As illustrated in FIG. 5, the FPC 107 includes a connecting portion 112, a transmission line 114, and the openings through which the above-mentioned lead terminals 102a and 102b pass. As illustrated in FIG. 5, the connecting portion 112 is formed on a part of an edge portion of the FPC 107.

Specifically, for example, as illustrated in FIG. 5 and FIG. 7, the FPC 107 includes a roughly semicircular-shaped notch. The connecting portion 112 is formed as two electrodes formed extending from a ground layer 702 of the FPC 107 in the notch. Here, the FPC 107 includes, for example, as illustrated in FIG. 7, in order from the side on which the stem 101 is arranged, a dielectric layer 701, the ground layer 702 on which a ground pattern is formed, an insulating layer 703, a conductive layer 704 on which a wiring pattern is formed, and a dielectric layer 705. The connecting portion 112 and the stem 101 are connected to each other by soldering between the surface of the stem 101 and the connecting portion 112. Thus, although in the related art the ground connection between the FPC and the stem is achieved via the ground pin 102c, in this embodiment, the FPC and the stem are connected to each other via two electrodes formed extending from the ground layer 702 of the FPC 107 without the ground pin 102c being arranged between the FPC and the stem.

Further, as illustrated in FIG. 5, it is preferred that those two electrodes be arranged between a position at which the lead terminals 102a pass through the FPC 107, namely, the lead terminal connecting positions illustrated in FIG. 5, and a position at which the FPC 107 is to be bent. As a result, when the FPC 107 is bent, peeling or lifting of the FPC 107 can be suppressed.

In addition, this embodiment is capable of employing the following configuration as a result of not using the ground pin 102c. As illustrated in FIG. 5, the FPC 107 includes, on the surface of the FPC 107, the transmission line 114 that is connected to the lead terminal 102a. Further, as illustrated in FIG. 5, the transmission line 114 includes a matching portion 113a having a different width from a straight region of the transmission line 114. With this, the characteristic impedance changes in steps in the direction from the straight region of the transmission line 114 toward the lead terminal 102a, thereby allowing reflections occurring due to characteristic impedance mismatches to be suppressed. Specifically, the transmission line 114 is set so as to match the output impedance of the drive device for driving the optical module 130. For example, the transmission line 114 of the FPC 107 matches 25 [Ω].

In contrast, the characteristic impedance of the coaxial line formed from the stem 101 and the lead terminal 102a passing through the stem 101 is generally subject to the following limitations, which means that it is difficult to match the characteristic impedance of the coaxial line with the characteristic impedance of the transmission line 114. Although the characteristic impedance of the coaxial line can be adjusted based on the diameter of the lead terminals 102a and the diameter of the through-holes of the stem 101, the minimum diameter of the lead terminals 102a is limited by the processing precision of the lead terminals 102a. Further, the diameter of the stem 101 is limited by the demands stipulated in the standards and the need to reduce the size of the module. In addition, the maximum diameter of the through-holes of the stem 101 is limited by the fact that a sufficient area for mounting the components on the stem 101 needs to be ensured. In other words, it is difficult to reduce the capacity of the coaxial line, namely, increase the characteristic impedance of the coaxial line, by reducing the diameter of the lead terminals 102a and increasing the diameter of the through-holes.

Therefore, for example, the diameter of the through-holes in the stem 101 of the optical module 130 is set to 1 mm and the diameter of the lead terminals 102a is set to 0.45 mm. Further, the relative permittivity of the insulator 103 is set to 6.5. In this case, the characteristic impedance of the coaxial line is about 18Ω, which is lower than that of the transmission line 114 of the FPC 107.

Thus, the characteristic impedance is reduced in steps by, as described above, arranging the matching portion 113a so that the transmission to the coaxial line is made via the matching portion 113a. Consequently, reflections occurring due to characteristic impedance mismatches may be suppressed.

In this embodiment, as described above, an opening for passing the ground pin 102c through the FPC 107 is not formed in the FPC 107. Therefore, unlike a configuration that includes an opening for the ground pin 102c, a region that was not able to be used because a welded portion 102d of the ground pin 102c was present can be used, which enables the matching portion 113a to be arranged. In this manner, the degree of freedom in the design of the shape of the transmission line can be improved. Consequently, the characteristic impedance can be effectively reduced in steps, and the high-frequency characteristics can be improved.

Further, because of the characteristic that the high-frequency component travels in a straight line, it is generally preferred that the transmission line 114 be laid in a straight line without bending until an impedance mismatch point. According to this embodiment, because the ground pin 102c is not used, the straight region can be longer. Further, reflection points can be reduced, and the matching portion 113a for reducing the characteristic impedance in steps heading from the transmission line 114 of the FPC 107 toward the coaxial line passing through the stem 101 can be arranged immediately before the connecting portion 112 of the FPC 107 with the lead terminals 102a. As a result, according to this embodiment, it is possible to provide the optical transmitter module that has better high-frequency characteristics and that is capable of outputting a high-speed optical signal of 10 Gbit/s or more at a low cost due to the use of an inexpensive stem.

Figure 8:
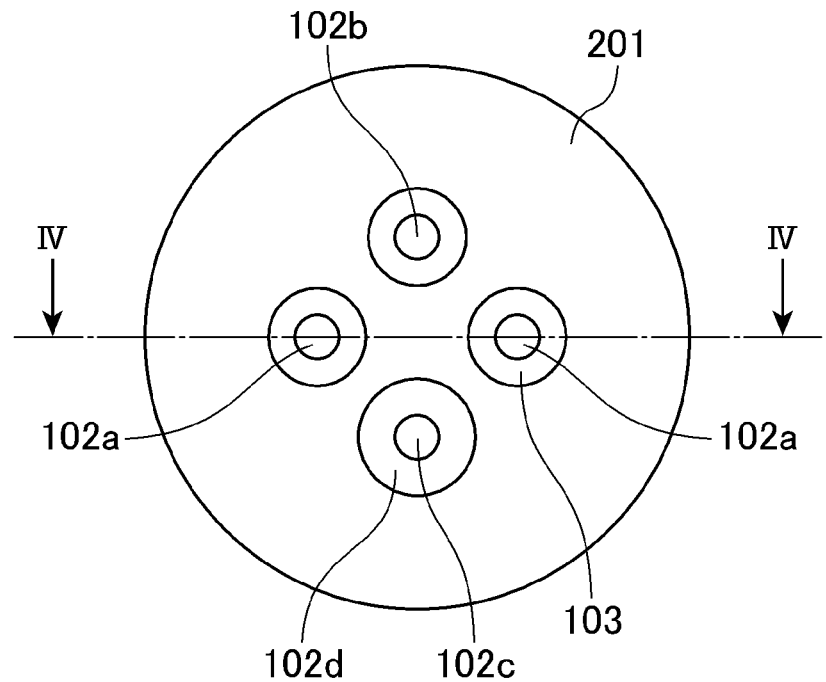
FIG. 8 is a diagram for illustrating an example of a front view of the stem of the optical module according to the first embodiment.
Figure 9:
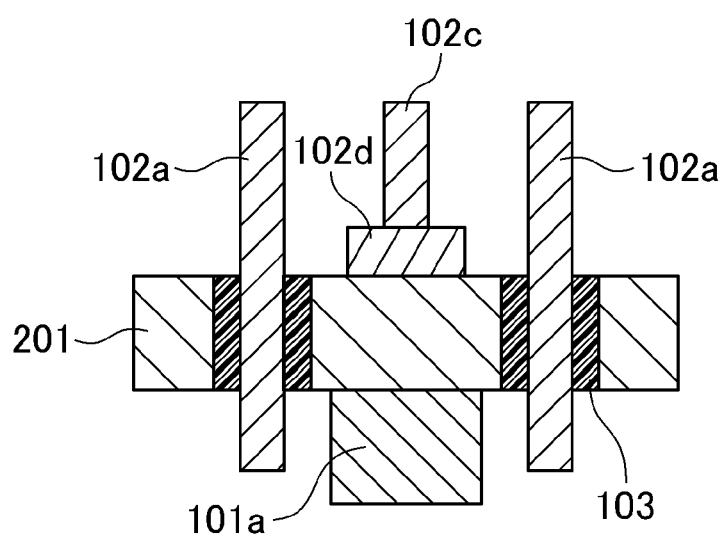
FIG. 9 is a diagram for illustrating an example of an outline of a cross-section taken along the line IV-IV of FIG. 8.

Note that, in this embodiment, it is described that the stem does not include the ground pin and the welded portion thereof from the beginning. However, as illustrated in FIG. 8 and FIG. 9, for example, a stem 201 that includes the ground pin 102c and the welded portion 102d may also be used. In the stem 201, a trench has not been formed in the welded portion 102d. Such a stem 201 is mainly used in optical modules having a speed of 10 Gbit/s or less, and has a feature of being mass produced and thus having a low cost.

When the stem 201 is used, before connecting the FPC 107, the welded portion 102d and the ground pin 102c are removed, and then the FPC 107 and the stem 201 are connected to each other by the connecting portion 112 in the above-mentioned manner. Through the employment of the stem 201, a versatile, low-cost stem that is mass produced can be used, which enables an inexpensive optical module to be obtained.

Next, an outline of a method of manufacturing the optical module 130 according to this embodiment when the stem 201 is used is described. For example, first, as illustrated in FIG. 6, the stem 101 including the lead terminals 102a and 102b, and the ground pin 102c is prepared. Next, the optical semiconductor device, the lens 111, and the like are arranged and a cap is mounted thereon. Then, in a state in which the FPC 107 has not been mounted, a continuity test of the optical semiconductor device is carried out using the lead terminals 102a and 102b, and the ground pin 102c. When the continuity of the optical semiconductor device is confirmed, next, the ground pin 102c is removed. At this stage, it goes without saying that the welded portion 102d of the ground pin 102c is also removed. Next, for example, as illustrated in FIG. 5 to FIG. 7, the FPC 107 is arranged on the stem 101. Here, the stem 101 corresponds to the stem 201 from which the ground pin 102c and the like have been removed in the manner described above. Further, it also goes without saying that the lead terminals 102a and 102b are arranged so as to pass through the respective corresponding openings formed in the FPC 107. Next, the stem 101 and the connecting portion 112 of the FPC 107 are soldered so that the stem 101 and the connecting portion 112 are connected to each other by a solder portion 108. Then, the optical module 130 is realized by, for example, bending the FPC 107, connecting the drive device, and the like.

The present invention is not limited to the embodiment described above. The structure described in the above-mentioned embodiment may be replaced by substantially the same structure, a structure having the same action and effect, and a structure that may achieve the same object.

[Second Embodiment]

Next, a second embodiment of the present invention is described. The main differences in this embodiment are the point that the ground pin 102c is not removed from the stem 201 after the continuity test that is carried out before the FPC 107 is connected, and the point that a penetration hole 115 through which the ground pin 102c passes is formed in the FPC 107. Note that, in the following description, a description of matters that are the same as in the first embodiment is omitted.

Figure 10:
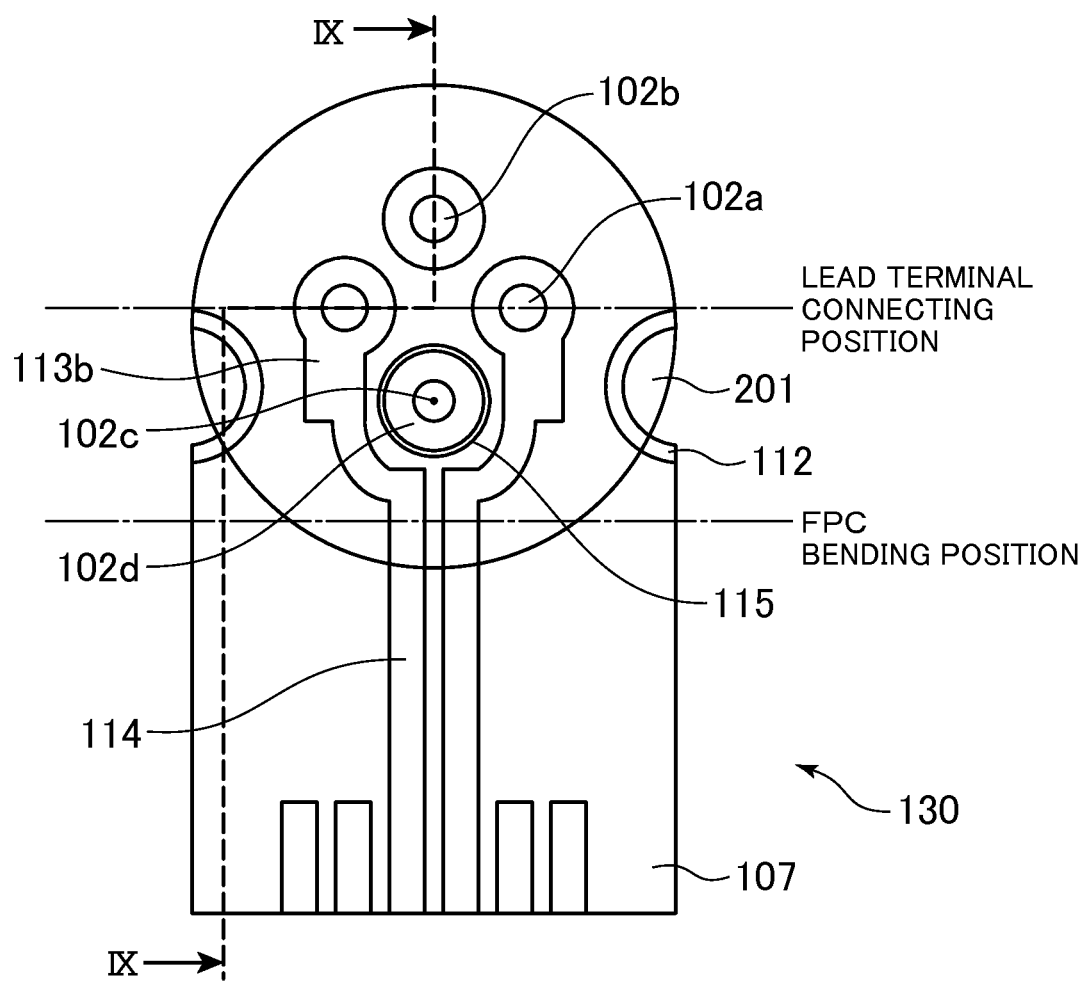
FIG. 10 is a diagram for illustrating an optical module according to a second embodiment of the present invention.
Figure 11:
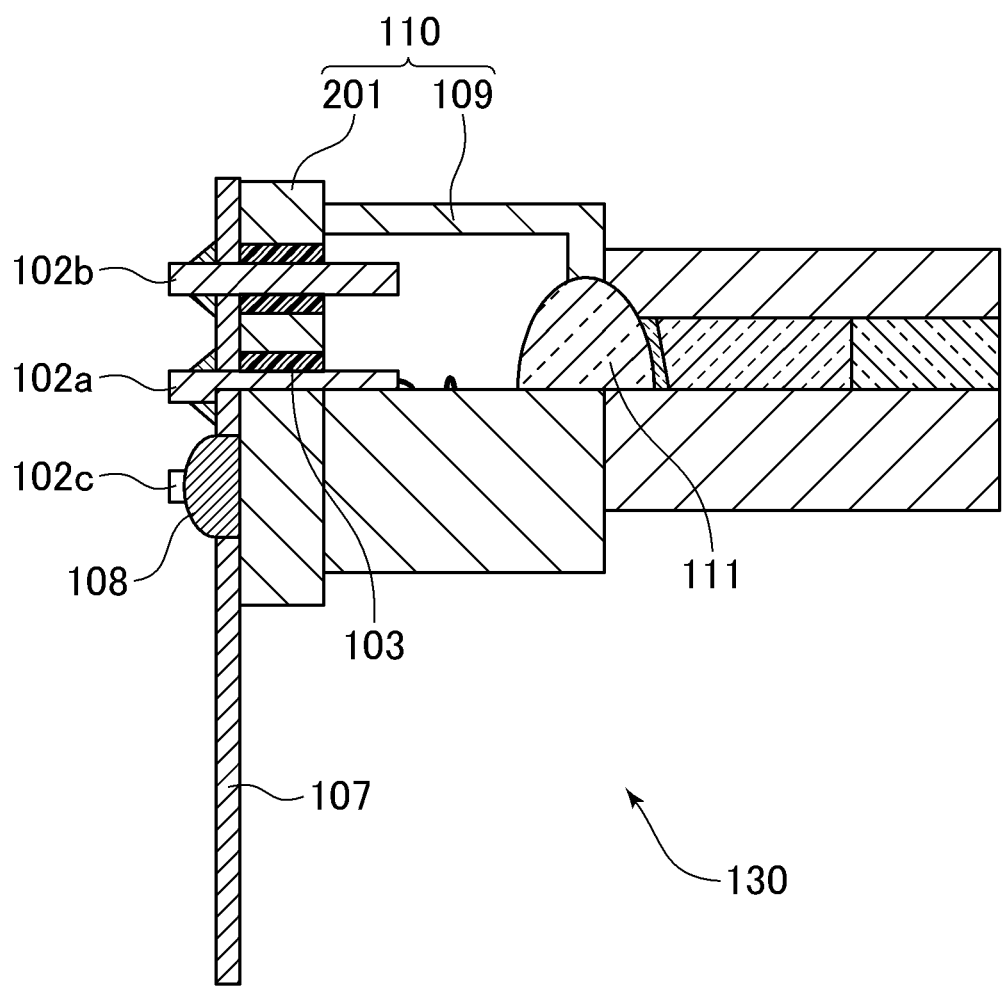
FIG. 11 is a diagram for illustrating an example of an outline of a cross-section taken along the line IX-IX of FIG. 10.

FIG. 10 is a diagram for illustrating an optical module according to the second embodiment of the present invention. FIG. 11 is a diagram for illustrating an example of an outline of a cross-section taken along the line IX-IX of FIG. 10.

In this embodiment, as illustrated in FIG. 10 and FIG. 11, similar to the first embodiment described above, the connecting portion 112 is formed on a part of the edge portion of the FPC 107. Further, in this embodiment, in the FPC 107, when the FPC 107 is arranged on the stem 201, the penetration hole 115 of the FPC 107 is formed so as to avoid the welded portion 102d of the ground pin 102c. Note that, the penetration hole 115 is mere a hole and is not a through-hole having a through hole plating. In the first embodiment, because the ground pin 102c is not included, or is initially included but then removed, the transmission line 114 may be laid in a straight line up to near the connecting portion 112 between the FPC 107 and the lead terminals 102. However, in this embodiment, the welded portion 102d is present. Therefore, in order to avoid the welded portion 102d, the transmission line 114 is formed so as to surround the penetration hole 115.

Here, in this embodiment, a direct, electrical connection between the ground layer 702 of the FPC 107 and the stem 201 that uses the ground pin 102c is not provided. Therefore, there is no need to arrange a land pattern around the welded portion 102d or to form a through-hole, and hence the region in which the transmission line 114 is bent can be suppressed to a minimum. Further, similar to the first embodiment, an adjustment circuit 113b that has a characteristic impedance set to be low can be arranged immediately before the connecting portion 112 between the lead terminals 102a and the FPC 107.

Note that, the position at which the connecting portion 112 is arranged is the same as in the first embodiment. Consequently, the transmission line 114 may be laid up to near the connecting portion between the lead terminals 102a and the FPC 107, which is a reflection point, without forcing the transmission line 114 to be wound unnecessarily around the stem 201 to which the ground pin 102c is already welded. Therefore, the adjustment circuit 113b for bringing the characteristic impedance closer in steps to the impedance of the low-impedance coaxial line can be arranged.

Next, an outline of a method of manufacturing the optical module 130 according to this embodiment is described. First, for example, as illustrated in FIG. 8 and FIG. 9, the stem 201 including the lead terminals 102a and the ground pin 102c is prepared. Next, a continuity test is carried out in the same manner as in the first embodiment. Next, for example, as illustrated in FIG. 10, the FPC 107 is arranged on the stem 201. Here, the lead terminals 102a and 102b are arranged so as to pass through the respective corresponding openings and the penetration hole 115, and are soldered. At this stage, the ground pin 102c is only passed through the through-hole 115, and is not soldered. Next, the stem 201 and the connecting portion 112 of the FPC 107 are soldered. Then, the optical module 130 is completed by bending the FPC 107 and the like.

According to this embodiment, while using an inexpensive stem, which is mass produced in a versatile manner and in which a trench is not formed in a welded portion, a step of removing the ground pin 102c and the welded portion 102d is unnecessary, which allows the manufacturing costs to be reduced. Further, even when employing an inexpensive stem in which the welded portion of the ground pin protrudes from the stem, because an opening that allows the FPC 107 to avoid the ground pin 102c and the welded portion 102d is formed, the FPC 107 can be brought into close contact with the stem 201, thereby allowing the optical transmitter module having a low cost and excellent high-frequency characteristics to be provided.

The present invention is not limited to the first and second embodiments described above. Each of the structures described in the above-mentioned embodiments may be replaced by substantially the same structure, a structure having the same action and effect, and a structure that may achieve the same object.

[Third Embodiment]

Next, a third embodiment of the present invention is described. The main difference between this embodiment and the second embodiment is the point that the ground layer 702 of the FPC 107 and the stem 201 are connected to each other by soldering a portion of the ground layer 702 of the FPC 107 exposed from the surface of the FPC 107 and the stem 201. Note that, in the following description, a description of the matters that are the same as in the second embodiment is omitted.

Figure 12:
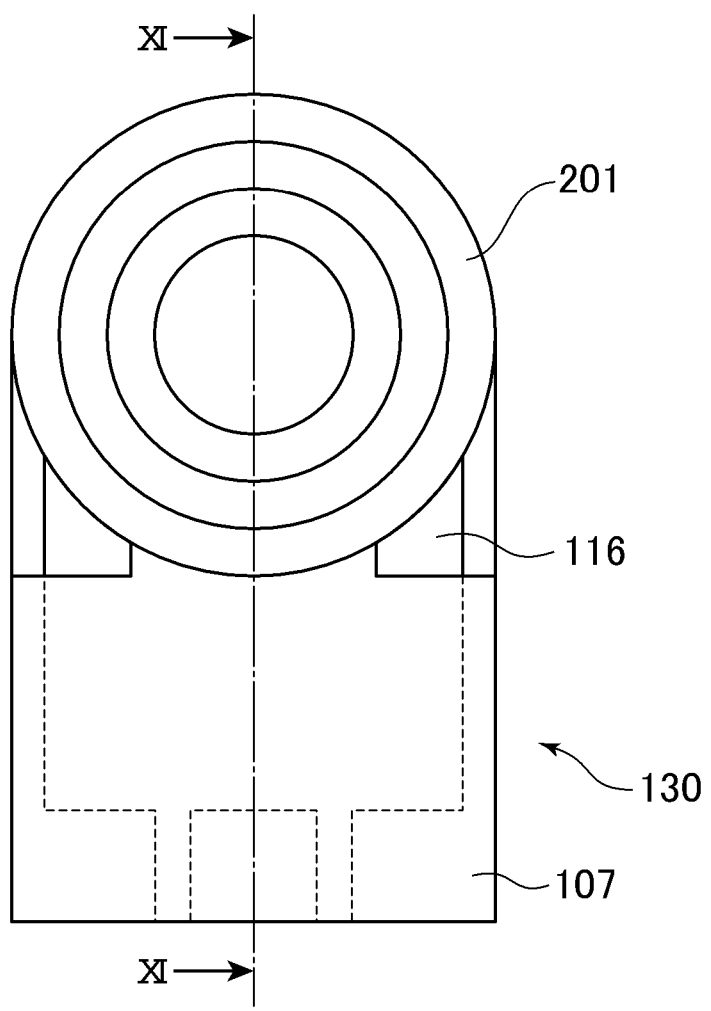
FIG. 12 is a diagram for illustrating an optical module according to a third embodiment of the present invention.
Figure 13:
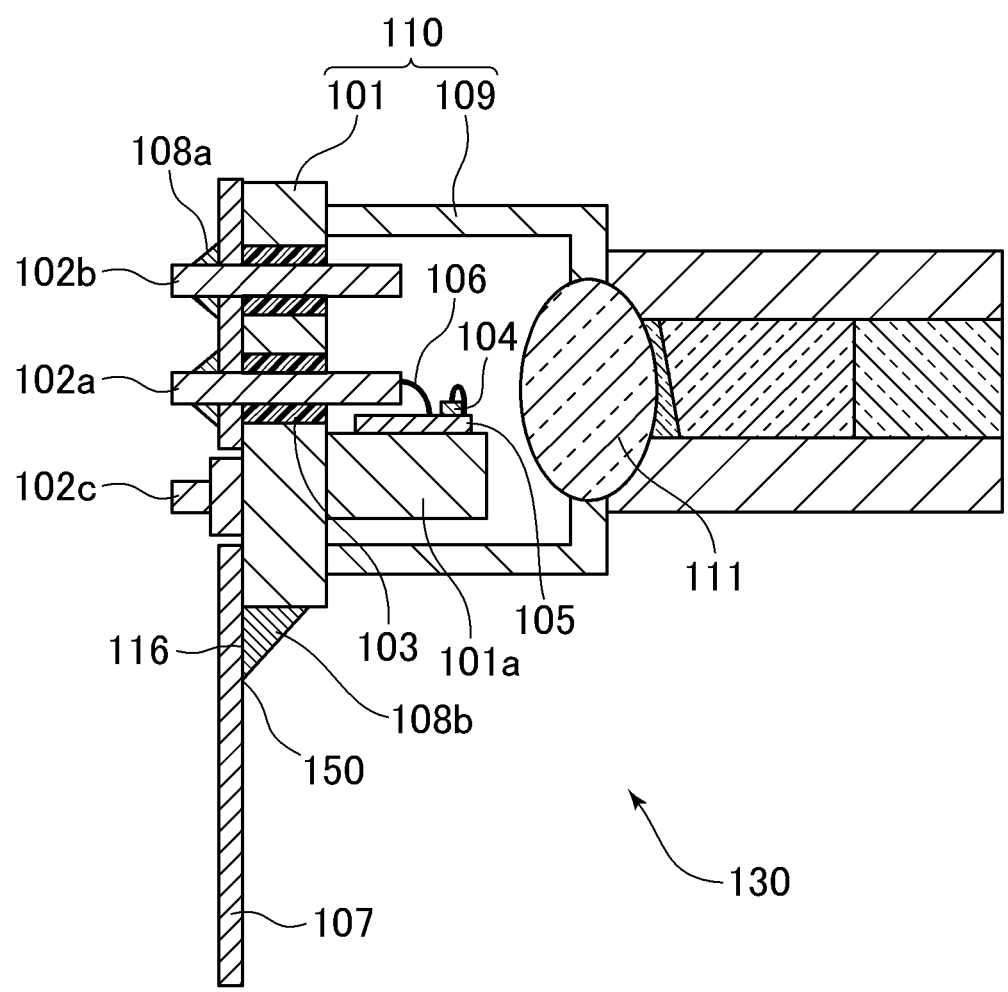
FIG. 13 is a diagram for illustrating an example of an outline of a cross-section taken along the line XI-XI of FIG. 12.
Figure 14:
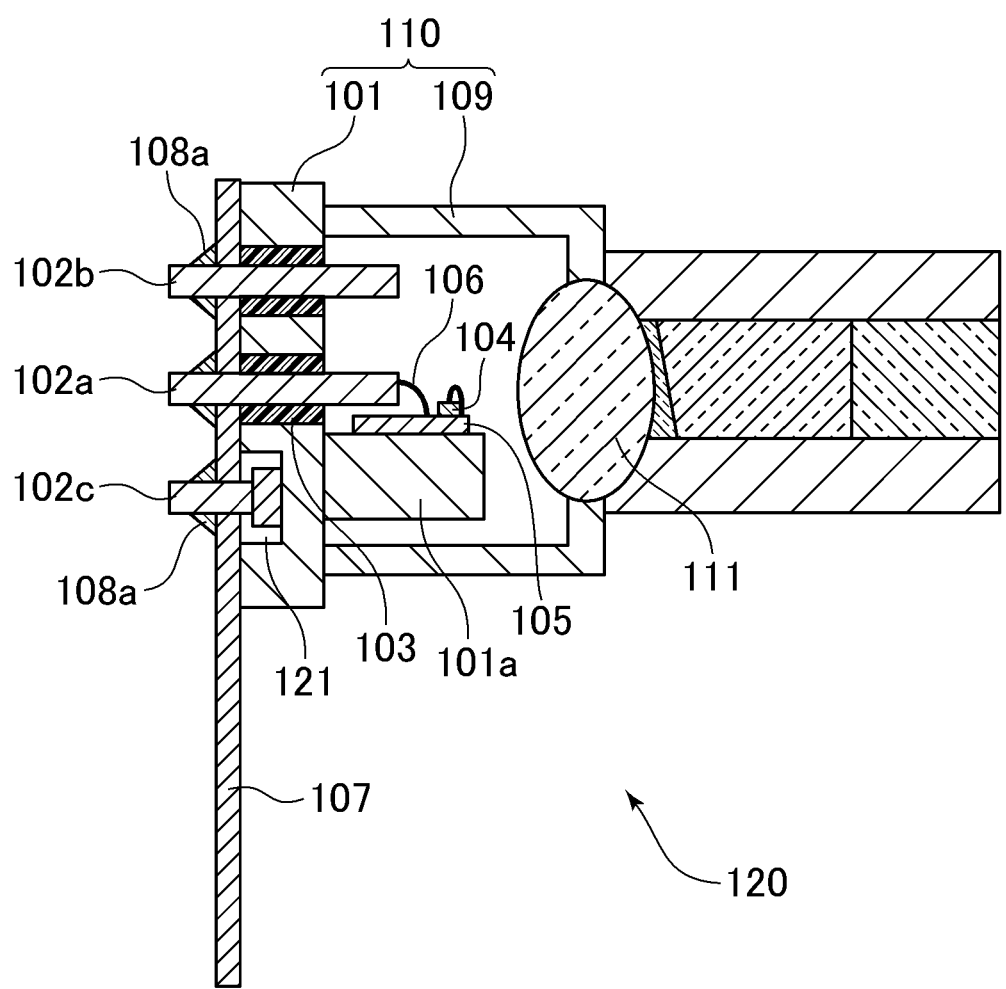
FIG. 14 is a diagram for illustrating an optical module according to the related art.

FIG. 12 is a diagram for illustrating an optical module according to the third embodiment of the present invention. Specifically, FIG. 12 is an illustration of an example of a front view of the optical module 130 as viewed from the opposite side of the surface on which the FPC 107 is mounted. FIG. 13 is a diagram for illustrating an example of an outline of a cross-section taken along the line XI-XI of FIG. 12.

As illustrated in FIG. 12, the FPC 107 includes connecting portions 116 from which the ground layer 702 is exposed on a part of a surface thereof connecting to the stem 201. Specifically, for example, it is preferred that two connecting portions 116 be formed on both sides of the surface where the stem 201 is arranged on the FPC 107 as viewed from the center of the stem 201. Further, it is desired that the exposed region be on a part of an outer side of a region at which the stem 201 and the FPC 107 oppose each other. In this manner, the operability of the soldering can be improved at the connection between the connecting portion 116 of the FPC 107 and the stem 201, as illustrated in FIG. 13. Further, it is desired that the position of the connecting portion 116 be between the position at which the lead terminals 102a are to be soldered and the bending position of the FPC 107. Note that, when the FPC 107 is bent, as illustrated in FIG. 13, the FPC 107 may be bent at an edge portion 150 of a solder portion 108b.

As illustrated in FIG. 13, at those two connecting portions 116, the ground layer 702 of the FPC 107 and the stem 201 are connected to each other by soldering the side surface of the stem 201 and the connecting portions 116 using the solder portion 108b. Further, the transmission line 114 is, for example, the same as in the second embodiment.

In addition, the transmission line 114 to be formed on the FPC 107 may be formed in the same manner as in the first embodiment by, similar to the first embodiment, using the stem 101 that does not include the ground pin 102c from the beginning, or using the stem 201 from which the ground pin 102c and the welded portion 102d have been removed before connecting the FPC 107. In the former case, the FPC 107 does not need to include the penetration hole 115 through which the ground pin 102c passes. Further, for example, the connecting portion for connecting the ground layer 702 and the stem 201 may be arranged on an outer side of the housing 110. This enables disconnections to be prevented, and the ground to be strengthened.

According to this embodiment, similar to the first and second embodiments, it is possible to provide the optical transmitter module that has better high-frequency characteristics and that is capable of outputting a high-speed optical signal of 10 Gbit/s or more at a low cost due to the use of an inexpensive stem.

The present invention is not limited to the above-mentioned first to third embodiments. Each of the structures described in the above-mentioned embodiments may be replaced by substantially the same structure, a structure having the same action and effect, and a structure that may achieve the same object. For example, in the third embodiment, the case is mainly described in which the connecting portions 116 of the FPC 107 are arranged at two locations on the edge portion of the stem 201. However, the position and number of the connecting portions 116 of the FPC 107 are not limited to the position and number described above. For example, when the FPC 107 is arranged on the stem 201, the FPC 107 may include an opening at a position corresponding to an inner side of the periphery of the stem 201, and an inner-side side surface of the opening employed as a connecting portion. Further, although the case is mainly described above in which the lead terminal 102b is included, the lead terminal 102b may be omitted. Note that, the meaning of the term "edge portion of the substrate" in the appended claims includes, in addition to the edge portion of the FPC 107, an inner-side edge portion of the above-mentioned opening.

In addition, although the optical transmitter module is described in the first to third embodiments, it goes without saying that the present invention may also be applied to an optical receiver module.

While there have been described what are at present considered to be certain embodiments of the invention, it will be understood that various modifications may be made thereto, and it is intended that the appended claims cover all such modifications as fall within the true spirit and scope of the invention.

What is claimed is:

1. An optical module, comprising:
   an optical semiconductor device;
   a stem comprising a lead terminal configured to perform at least one of transmitting an electric signal to the optical semiconductor device or transmitting an electric signal output from the optical semiconductor device; and
   a substrate comprising a ground layer, a first opening through which the lead terminal passes, a connecting portion configured to electrically connect the stem and the ground layer, and a transmission line electrically connected to the lead terminal,
   wherein the connecting portion is formed on one of an edge portion of the substrate and a surface of the substrate on a side on which the substrate is arranged on the stem.

2. The optical module according to claim 1, wherein the connecting portion formed on the edge portion of the substrate comprises an electrode portion formed extending from the ground layer in a notch of the substrate.

3. The optical module according to claim 1, wherein the connecting portion formed on the surface of the substrate on the side on which the substrate is arranged on the stem is formed so that the ground layer is exposed at a part of an outer side of a region of the substrate at which the substrate and the stem oppose each other.

4. The optical module according to claim 1,
   wherein the stem further comprises a ground pin extending from a surface of the stem on a side on which the substrate is arranged, and
   wherein the substrate further comprises a second opening through which the ground pin passes.

5. The optical module according to claim 1,
   wherein the transmission line comprises a straight region and a matching region having a larger width than the straight region.

6. The optical module according to claim 5, wherein the connecting portion is formed between a position at which the lead terminal and the transmission line of the substrate are connected to each other and a position at which the substrate is to be bent.

7. The optical module according to claim 1, wherein the connecting portion is electrically connected to the stem by a solder portion.

* * * * *